United States Patent
Dossi

(10) Patent No.: US 12,294,375 B2
(45) Date of Patent: May 6, 2025

(54) ADAPTIVE LOW-PASS FILTER FOR ZERO-CROSSING DETECTION

(71) Applicant: STMicroelectronics International N.V., Geneva (CH)

(72) Inventor: Guido Dossi, Monza Brianza (IT)

(73) Assignee: STMicroelectronics International N.V., Geneva (CH)

( * ) Notice: Subject to any disclaimer, the term of this patent is extended or adjusted under 35 U.S.C. 154(b) by 11 days.

(21) Appl. No.: 18/371,038

(22) Filed: Sep. 21, 2023

(65) Prior Publication Data

US 2025/0105831 A1    Mar. 27, 2025

(51) Int. Cl.
  *H03K 5/1536*  (2006.01)
  *H03H 11/04*  (2006.01)
  *H03K 5/156*  (2006.01)

(52) U.S. Cl.
  CPC ........... *H03K 5/1536* (2013.01); *H03H 11/04* (2013.01); *H03K 5/1565* (2013.01)

(58) Field of Classification Search
  CPC ................................................... H03K 5/1536
  USPC .......................................................... 327/97
  See application file for complete search history.

(56) References Cited

U.S. PATENT DOCUMENTS

| | | |
|---|---|---|
| 2008/0109503 A1 | 5/2008 | Gross et al. |
| 2010/0117706 A1* | 5/2010 | Stojanovic ........... H04B 1/0475 327/306 |
| 2011/0291735 A1 | 12/2011 | Thirugnanasambandham et al. |
| 2014/0062458 A1 | 3/2014 | Bergas et al. |
| 2016/0254766 A1 | 9/2016 | Brown |

(Continued)

FOREIGN PATENT DOCUMENTS

| | | |
|---|---|---|
| CN | 107643442 A | 1/2018 |
| CN | 112540219 A | 3/2021 |

(Continued)

OTHER PUBLICATIONS

Rodrigues, Nuno M., et al.: "Digital Filter Performance for Zero Crossing Detection in Power Quality Embedded Measurement Systems," IEEE, Jul. 12, 2023, 6 pgs.

(Continued)

*Primary Examiner* — Tomi Skibinski
(74) *Attorney, Agent, or Firm* — Crowe & Dunlevy LLC

(57) ABSTRACT

A circuit detects zero crosses in an input-signal and includes a low-pass-filter (LPF) receiving the input-signal and introducing a phase-shift dependent on the frequency thereof. Filter circuitry receives the output of the LPF, applies a fixed phase-shift thereto, and adjusts phase and DC-offset thereof based on control signals to produce a filtered output-signal. Control circuitry has a zero-crossing detector receiving the input-signal and the filtered output-signal, detecting zero-crossings of the input-signal and the filtered output-signal, asserting a digital zero cross signal at each zero crossing, and determining a phase-shift and DC-offset between the input-signal and filtered output-signal. The control circuitry has a controller generating the control signals, based upon the phase-shift and DC-offset, so a total phase-shift between the input-signal and the filtered output-signal is constant and there is a same duty-cycle between the input-signal and the filtered output-signal, providing for accurate zero-crossing detection.

23 Claims, 9 Drawing Sheets

(56) References Cited

U.S. PATENT DOCUMENTS

2019/0363687 A1 11/2019 Burgio
2021/0218383 A1 7/2021 Razzell
2023/0228614 A1 7/2023 Brengartner et al.

FOREIGN PATENT DOCUMENTS

DE 19535271 A1 11/1998
JP 2005166037 A 6/2005

OTHER PUBLICATIONS

Vainio 0 et al.: "Adaptive lowpass filters for zero-crossing detectors", IECON-2002. Proceedings of the 28th. Annual Conference of the IEEE Industrial Electronics Society. Sevilla, Spain, Nov. 5-8, 2002; [Annual Conference of the IEEE Industrial Electronics Society], IEEE, New York, NY, US, vol. 2, Nov. 5, 2002 (Nov. 5, 2011), pp. 1483-1486, XP010632925.
EP Search Report and Written Opinion for counterpart EP Appl. No. 24197817.0, report dated Mar. 3, 2025, 9 pgs.

* cited by examiner

ADAPTIVE LOW-PASS FILTER FOR ZERO-CROSSING DETECTION

TECHNICAL FIELD

This disclosure is related to power quality (PQ) measurement systems and, more specifically, to a method and system for detecting the zero crossing (ZC) events of voltage and current signals with high degree of precision and reduced consumption of computational resources.

BACKGROUND

Electrical power grids are components of modern infrastructure. However, these grids are inherently noisy environments. Modern-day appliances, when connected to these grids, inject numerous disturbances on both voltage and current signals. This has posed challenges in the accurate monitoring and measurement of energy consumption.

One of the primary mechanisms by which power quality (PQ) measurement systems monitor energy consumption and synchronize root mean square (RMS) calculations is through the detection of zero crossing (ZC) events of voltage and current signals. The accuracy and precision of ZC detection play a pivotal role in maintaining the fidelity and reliability of the data collected by these systems.

However, achieving high precision in ZC detection is challenging, especially with the rising standards that require significant computational resources. Traditionally, ZC events have been detected using a low-pass filter (LPF) which aids in removing the noise and harmonics that could potentially distort the precision of the timestamps. While this approach offers a degree of noise and harmonic reduction, it has drawbacks. LPFs introduce a phase shift from input (signal In) to output (signal yout), a characteristic that is variable with the frequency of the signal. This phase shift may be observed in the graph of FIG. 1, for example.

This variability in phase shift is particularly concerning given that the primary frequency of power grid systems can fluctuate within specific ranges and may shift over time. Such phase shifts, while sometimes compensable with hardware and software procedures, typically cannot be corrected in real-time, leading to inaccuracies in the measurements.

Moreover a LPF may not be able to completely remove the harmonic components present in the input, so there could be a change in the shape of the output waveform and consequently a moving of the zero crossing and a change of the duty cycle.

There is therefore a need for a system that not only compensates for the inherent phase shifts introduced by LPFs automatically and over time but also mitigates the negative impacts of harmonics on the precision of ZC detection.

SUMMARY

Disclosed herein is a circuit configured for detection of a zero crossing in a power signal. The circuit includes a low-pass filter (LPF) configured to receive an input signal indicative of the power signal and to introduce a phase shift dependent on the frequency of the input signal, and filter circuitry. The filter circuitry is configured to receive the output of the LPF and to apply a fixed phase shift thereto, and adjust phase and DC offset of the output of the LPF based on control signals to produce a filtered output signal. Control circuitry includes a zero crossing detector configured to receive the input signal and the filtered output signal, detect zero crossings of the input signal and the filtered output signal, assert a digital zero cross signal at each zero crossing, and determine a phase shift and DC offset between the input signal and filtered output signal. The control circuitry further includes a controller configured to generate the control signals, based upon the phase shift and DC offset, such that a total phase shift between the input signal and the filtered output signal is constant and there is a same duty cycle between the input signal and the filtered output signal, thereby providing for accurate zero crossing detection by the zero crossing detector.

The control circuitry may also include a slope detector configured to, at each zero crossing of the input signal and the filtered output signal, determine the difference between slopes of the input signal and the filtered output signal and provide feedback to the controller to cause the controller to adjust phase and DC offset correction applied by the filter circuitry to the input signal based on the determined difference.

The controller may be configured to transition between multiple states to adjust the phase and DC offset correction applied by the filter circuitry, the multiple states including at least: a locked state, in which no adjustments are made to the phase correction; a phase fine state in which fine adjustments are made to the phase correction; a phase gross state in which gross adjustments are made to the phase correction; an offset fine state in which fine adjustments are made to the DC offset correction; and an offset gross state in which gross adjustments are made to the DC offset correction.

In the phase fine state and the phase gross state, the controller may be configured to utilize gross and fine lookup tables to determine adjustments for the phase correction applied by the filter circuitry to the input signal.

The gross lookup table may contain coefficients that increment the phase correction applied by the filter circuitry by different given gross degree values, and the fine lookup table may contain coefficients that increment the phase correction applied by the filter circuitry for given different fine degree values.

The gross and fine lookup may contain coefficients derived from historical zero crossing data of the input signal and output filtered signal.

The control circuitry may be configured to generate phase and offset adjustment control signals, and the filter circuitry may be configured to use these phase and offset adjustment control signals to adjust both the phase and the offset correction applied by the filter circuitry to the input signal.

The total phase shift between the input signal and the filtered output signal may be 180°.

The filter circuitry may include a fixed all-pass (FAP) filter configured to receive the output of the LPF and to apply the fixed phase shift thereto, and an adaptive all-pass (AAP) filter configured to receive the output of the FAP filter and adjust its phase and DC offset based on the control signals to produce the filtered output signal.

Also disclosed herein is a method for detecting a zero crossing in a power signal. The method includes receiving an input signal indicative of the power signal at a low-pass filter (LPF) which introduces a phase shift dependent on a frequency of the input signal, passing the output of the LPF through filter circuitry which applies a fixed phase shift thereto and which adjusts phase of the output of the LPF based upon received control signals to produce a filtered output signal, detecting zero crossings of the input signal and the filtered output signal and asserting a digital zero cross signal at each zero crossing, and determining a phase shift and DC offset between the input signal and filtered output signal. The method further includes generating the control signals based upon the determined phase shift and DC offset such that a total phase shift between the input signal and the filtered output signal remains constant and there is a same duty cycle between the input signal and the filtered output signal to thereby provide for accurate detection of the zero crossings of the input signal.

At each detected zero crossing of the input signal and the filtered output signal, the method may include determining a difference between slopes of the input signal and the filtered output signal. The method may include providing feedback based on the determined difference to adjust phase and DC offset correction applied by the AAP filter to the input signal.

The method may further include transitioning between multiple states to adjust the phase and DC offset correction applied to the input signal by the AAP filter, the states including at least: a locked state, in which no adjustments are made to the phase correction; a phase fine state in which fine adjustments are made to the phase correction; a phase gross state in which gross adjustments are made to the phase correction; an offset fine state in which fine adjustments are made to the DC offset correction; and an offset gross state in which gross adjustments are made to the DC offset correction.

During the phase fine state and the phase gross state, gross and fine lookup tables may be utilized to determine adjustments for the phase correction applied by the AAP filter to the input signal. Passing the output of the LPF through filter circuitry which applies a fixed phase shift thereto and which adjusts phase and DC offset of the output of the LPF based upon received control signals to produce a filtered output signal may include passing the output of the LPF through a fixed all-pass (FAP) filter which applies a fixed phase shift thereto, and passing the output of the FAP filter through an adaptive all-pass (AAP) filter which adjusts phase and DC offset of the output of the FAP filter based on received control signals to produce a filtered output signal.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein. Note that as discussed herein, the "offset" of a signal may refer to DC offset of that signal.

It has been previously discussed that power grid input noise, including harmonics, can interfere with accurate zero crossing (ZC) detection. Moreover, while a low-pass filter (LPF) can mitigate this noise, it may introduce a phase shift that complicates ZC detection. The variable nature of power grid frequencies (45 Hz to 65 Hz) further complicates matters, as the phase response of the LPF can fluctuate based on frequency. Still further, the operation of the LPF shifts the harmonics in the input signal to the LPF, changing the shape of the input signal such that the zero crossing indication of the output becomes unaligned with the zero crossing of the input.

Figure 1:
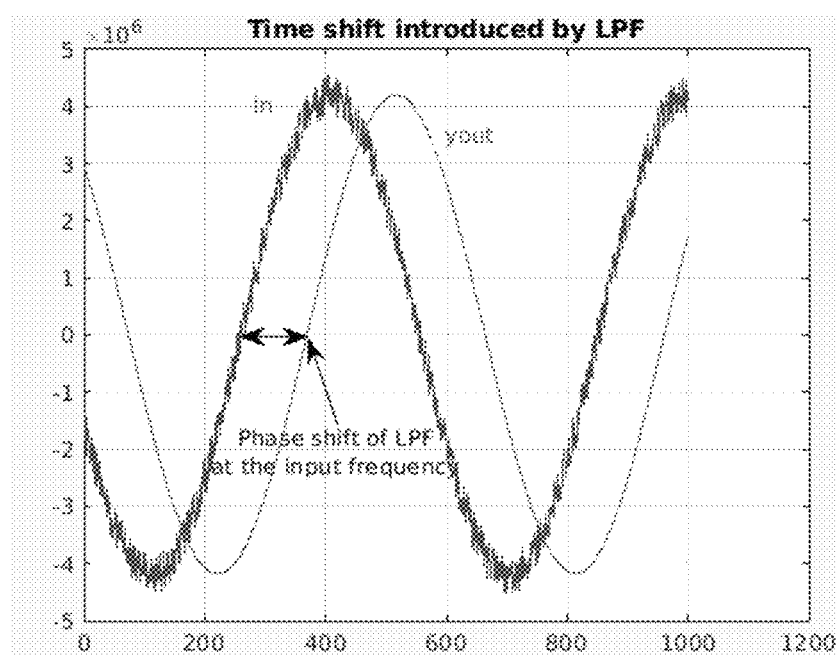
FIG. 1 is a graph showing the phase shift introduced by a low-pass filter to an input signal representative of a power signal.
Figure 2:
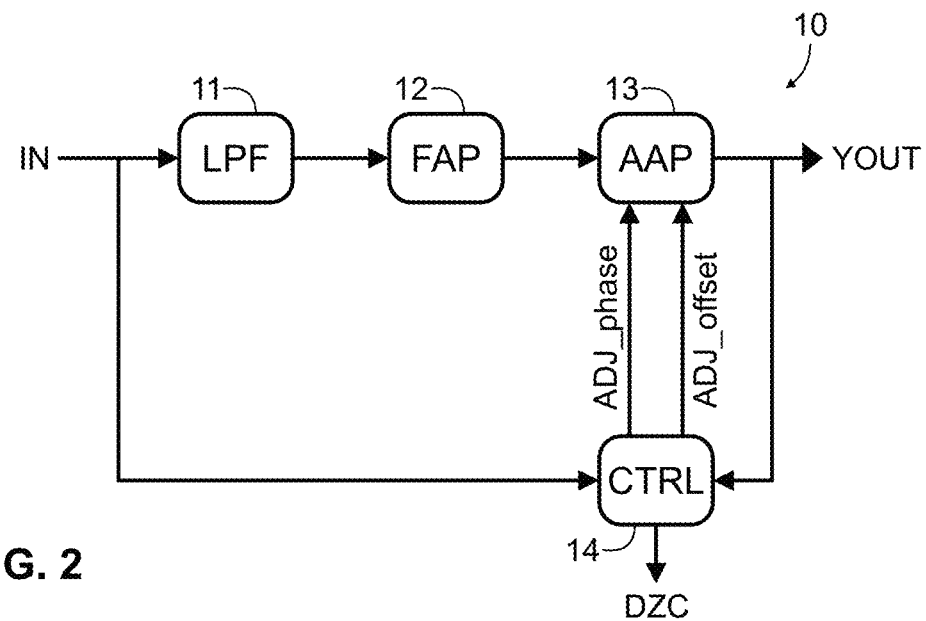
FIG. 2 is a block diagram of a zero-crossing detection circuit disclosed herein.

To address these challenges, reference is made to FIG. 2, which describes a circuit 10 configured to detect zero crossings (ZC) in power grid signals. Circuit 10 incorporates both a fixed all-pass (FAP) filter and an adaptive all-pass (AAP) filter in its signal processing chain. These components work together to dynamically adjust for phase shifts, harmonics, and other signal distortions so that there is a set constant phase shift between the input signal to the signal processing chain and the output signal from the signal processing chain and so that offset correction is performed to align the zero crossings of the input and output signals. When these conditions are met, ZC detection performed by the circuit 10 is accurate.

In greater detail, circuit 10 comprises a low-pass filter (LPF) 11 that receives an input signal (IN) indicative of a power signal. The LPF 11 filters the signal, introducing a phase shift that is at least partially dependent on the input frequency. Following this, the signal passes through the fixed all-pass (FAP) filter 12, which applies a consistent phase shift. Subsequently, the output from FAP 12 is routed to the adaptive all-pass (AAP) filter 13. The AAP 13 adjusts the phase and DC offset of the input signal based on control signals ADJ_phase and ADJ_offset received from control circuitry 14; stated differently, the control signals ADJ-_phase and ADJ_offset adjust the transfer function of the AAP 13. As a result, AAP 13 yields a filtered output signal YOUT. The goal is for the phase shift from the input signal IN to the filtered output signal YOUT to be a given desired value (e.g., 180°), with the set phase shift applied by the FAP 12 being a set fixed value (e.g., 80°) and the phase shift applied by the AAP 13 being a dynamically adjustable value (e.g., between 0° and 90°) to dynamically adapt to a phase shift applied by the LPF 11 (for example, 45° to 55°) that is dependent upon the frequency of the input signal IN. Regarding the offset, the goal is for a corrective offset to be applied to the output of the FAP 13 by the AAP 13 so that the displacement of the zero crossing in YOUT due to the shifting of harmonics by the LPF 11 is compensated by the adding of a proper offset.

In parallel, the control circuitry 14 analyzes both the original input signal (IN) and the filter output signal (YOUT) to generate the phase and offset adjustment control signals ADJ_phase and ADJ_offset. Included with the operations of the control circuitry 14 is the detection of zero crosses, in response to which the control circuitry 14 asserts a digital zero cross signal (DZC) when zero crossing of the input signal IN is identified.

This digital zero cross signal DZC may be used in the determination of power quality (PQ), for example, and is particularly accurate once convergence has been successful. Convergence refers to the process by which the zero-crossing detection circuit 10 self-adjusts and stabilizes to consistently and accurately detect zero-crossings of the input signal IN over consecutive cycles.

Figure 3:
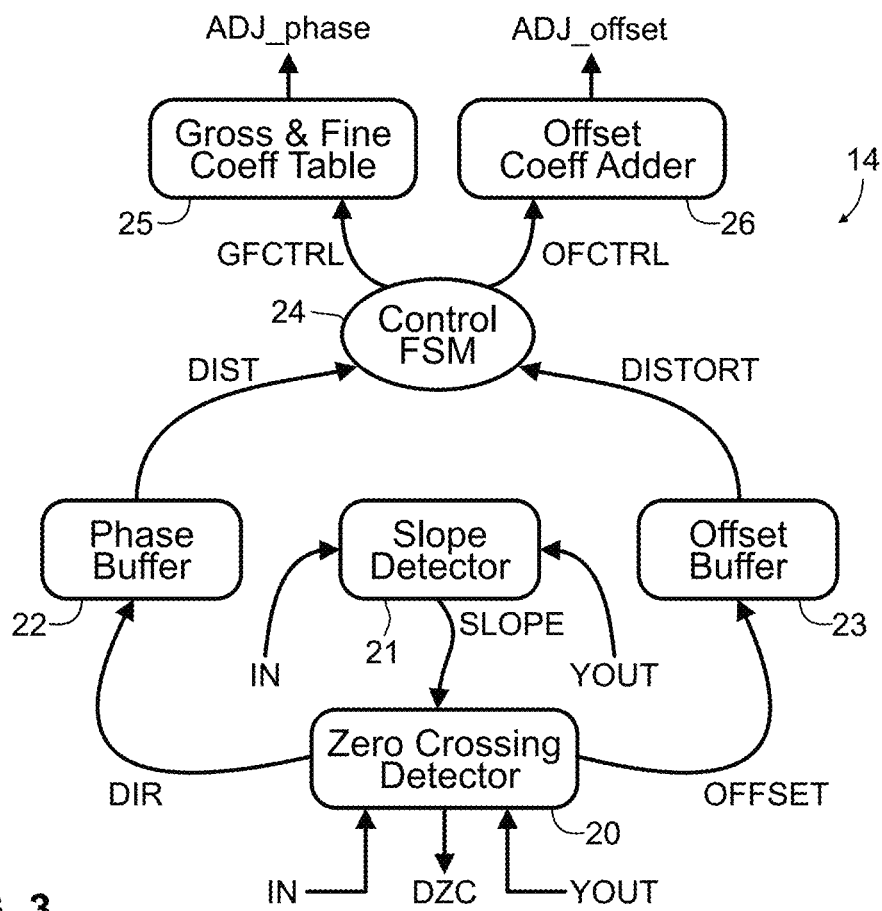
FIG. 3 is a block diagram of the control circuit of the zero-crossing detection circuit of FIG. 2.

The specifics of the control circuitry 14 are now described with additional reference to FIG. 3. The control circuitry 14 includes a zero crossing detector 20 that receives the input signal IN and the filtered output signal YOUT. In addition to generating the digital zero cross signal DZC, the zero crossing detector 20 evaluates the values of signals IN and YOUT at the zero crosses in order to determine the direction DIR (e.g., related to the phase shift between IN and YOUT) and offset OFFSET (related to distortion in IN, which as will be explained, will be used in calculating ADJ_offset).

Operations within the zero crossing detector 20 include, during each cycle, computing the combined value zc as (IN+YOUT)/2 every time either signal IN or signal YOUT crosses zero with positive slope. From this, two signals, INC and DEC, are derived. Specifically, when YOUT crosses zero, INC is set to 1 if (IN+YOUT)/2 exceeds a constant RESOL_THRES, otherwise it remains 0. Similarly, when IN crosses zero, DEC is set to 1 if (IN+YOUT)/2 exceeds a constant RESOL_THRES, otherwise it remains 0.

The DIR and OFFSET signals, output by the zero crossing detector 20, are decoded based on the following table:

| INC | DEC | DIR | OFFSET |
| --- | --- | --- | --- |
| 0 | 0 | 0 | 1 |
| 0 | 1 | -1 | 0 |
| 1 | 0 | 1 | 0 |
| 1 | 1 | 0 | -1 |

The RESOL_THRES constant is updated at each cycle by the zero crossing detector 20. This update depends on the peak value of the input IN and the estimated distortion in IN, as well as a calculated slope.

The determined direction DIR is integrated by a phase buffer 22 to produce a distance metric DIST that is proportional to the phase mismatch between IN and YOUT. The determined offset OFFSET is integrated by an offset buffer 23 to produce a distortion metric DISTORT that is proportional to the harmonics in signal IN.

Generation of DIST and DISTORT is now described. Both the phase buffer 22 and offset buffer 23 operate as first in, first out (FIFO) buffers, configured to collect the most recent N values (e.g., N=45) of the determined direction DIR and the determined offset OFFSET, respectively. As a cycle of the input signal IN completes, the contents of these buffers 22 and 23 are aggregated to compute the distance metric DIST and distortion metric DISTORT. Specifically:

$$DIST=DIR[0]+, \ldots, +DIR[44]; \text{ and}$$

$$DISTORT=OFFSET[0], \ldots, +OFFSET[44].$$

A finite state machine (FSM) 24 receives the distance metric DIST and the distortion metric DISTORT, and generates a gross/fine control signal GFCTRL and an offset control signal OFCTRL. The gross/fine control signal GFCTRL is used to perform lookups in respective gross/fine coefficient lookup tables 25 to generate the phase adjustment control signal ADJ_phase, and the offset control signal OFCTRL is provided to an adder 26 that incrementally changes and adds a constant to the offset adjustment control signal ADJ_offset, used by the AAP 13 in applying an offset to the output of the FAP 12 to achieve a condition of minimum for the metric DISTORT.

Figure 4:
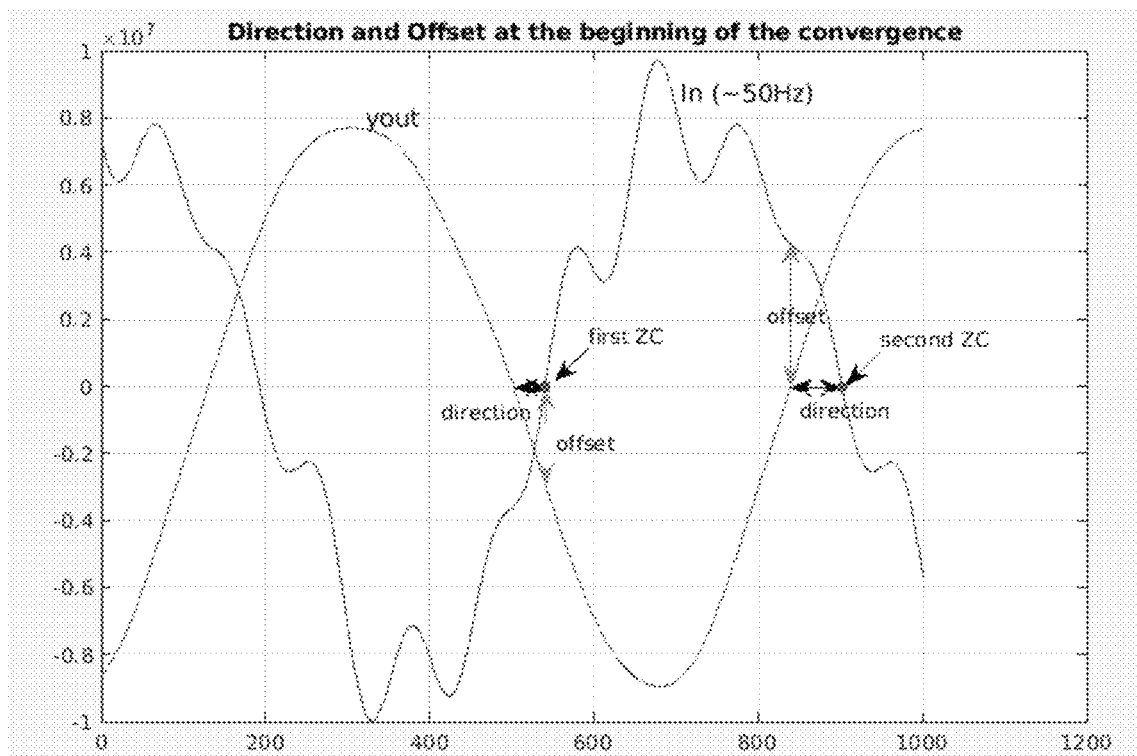
FIG. 4 is a graph showing phase and offset of the input signal of FIG. 2.
Figure 5:
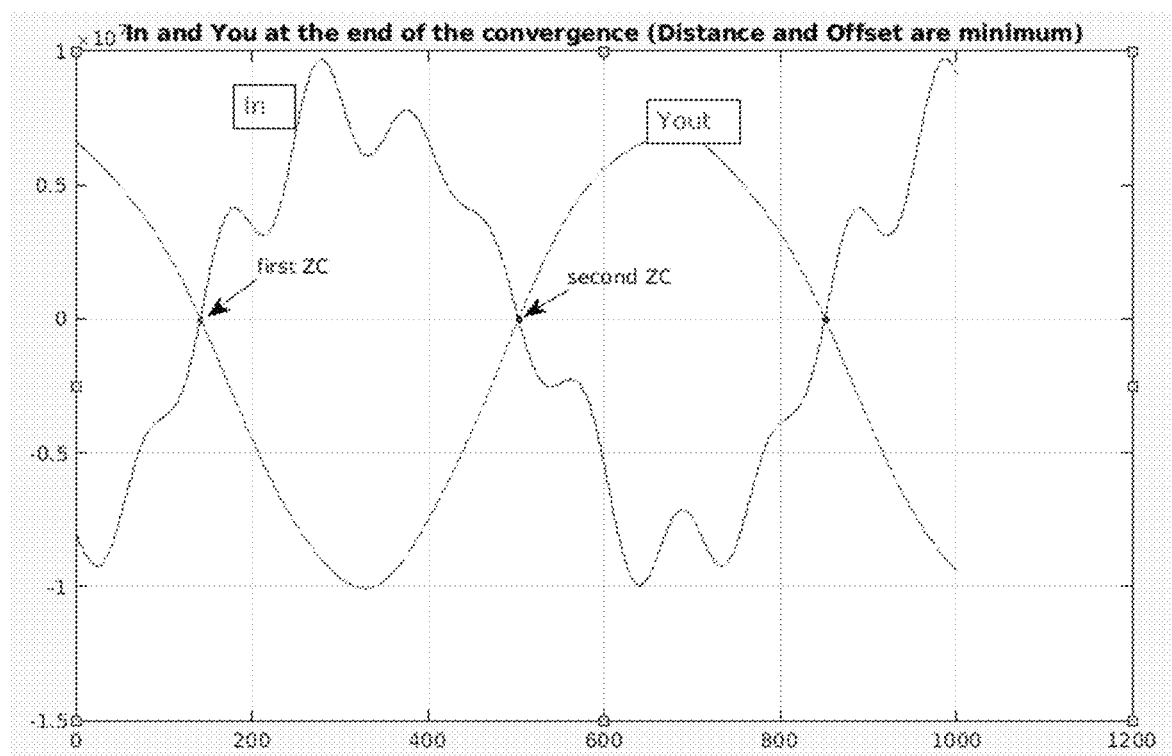
FIG. 5 is a graph showing phase and offset of the filtered output signal of FIG. 2.

The effect of the operation of the circuit 10 on the input signal IN to produce the filtered output signal YOUT may be seen in the series of FIGS. 4-5. For example, shown in FIG. 4 are signal IN and signal YOUT, with the phase shift (labeled as direction) and offset therebetween being indicated, and shown in FIG. 5 are signal IN and signal YOUT. Observe the substantial phase shift and offset present. Observe here in FIG. 5 that, opposed to FIG. 4, the phase shift is set to a desired value of substantially 180°, and no DC offset between IN and YOUT is present.

Figure 6:
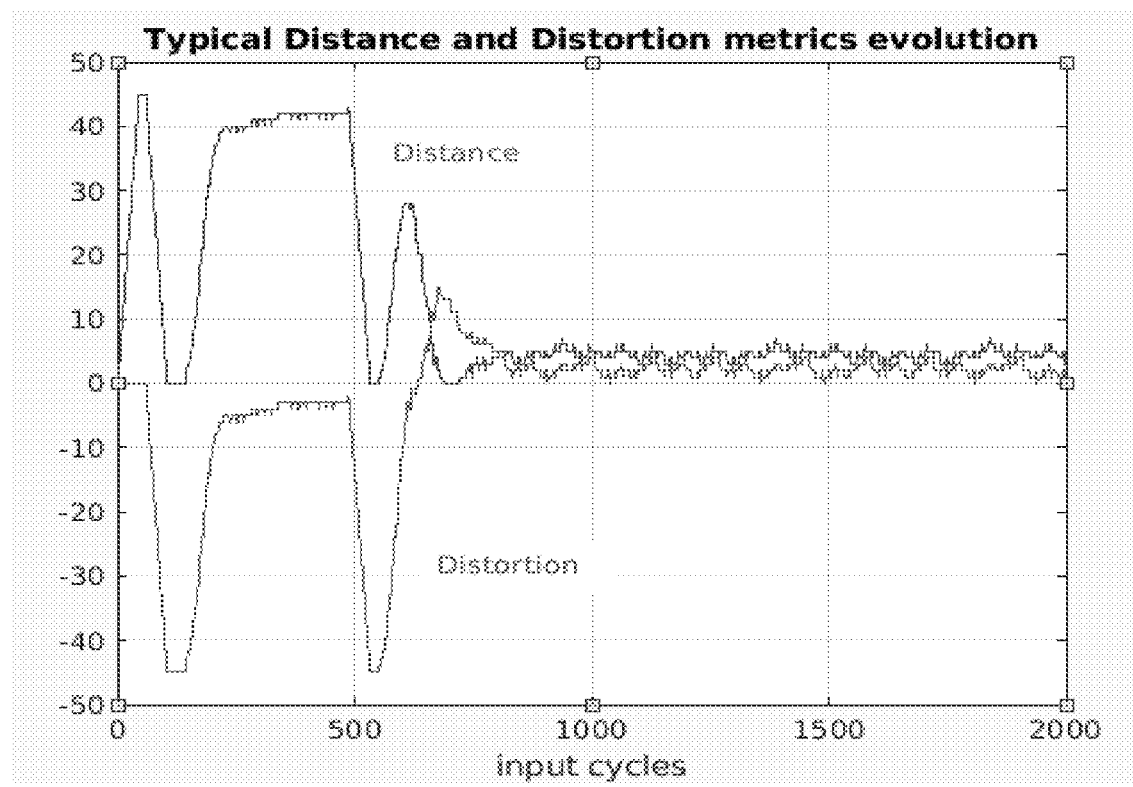
FIG. 6 is a graph showing the evolution of the distance and distortion metrics utilized by the FSM of FIG. 3 during operation.

The evolution of the distance metric DIST and distortion metric DISTORT over time through the operation of the FSM 24 generating new values of the phase adjustment control signal ADJ_phase and offset adjustment control signal ADJ_offset in response to new values of signals IN and YOUT may be seen in FIG. 6, where it is shown how these metrics converge about zero between 500 and 1000 cycles of the input signal IN.

Note the presence in FIG. 3 of a slope detector 21, which is activated at every zero crossing of the input signal IN. Upon each zero crossing event, the slope detector 21 computes the difference between the slopes of the input signal IN and filtered output signal YOUT, represented as:

$$SLOPE=Slope\_IN-Slope\_YOUT$$

This calculated SLOPE value influences the update of RESOL_THRES by the zero crossing detector 20, enhancing detection accuracy in the presence of harmonics. The relationship between SLOPE and RESOL_THRES is such that RESOL_THRES is proportional to SLOPE, and can be mathematically represented as:

$$RESOL_{THRES} = \frac{MAX(IN)}{4096} + \frac{SLOPE}{4}$$

Generally speaking, the FSM 24 generates ADJ_phase and ADJ_offset based upon DIST (an integer proportional to the phase mismatch between IN and YOUT) and DISTORT (an integer proportional to the harmonics in signal IN) so that there is a set constant phase (180 degrees) shift between IN and YOUT and such that IN and YOUT have the same duty cycle (e.g. the two ZC are identical). In this condition, as explained, zero crossing detection is accurate.

Figure 7:
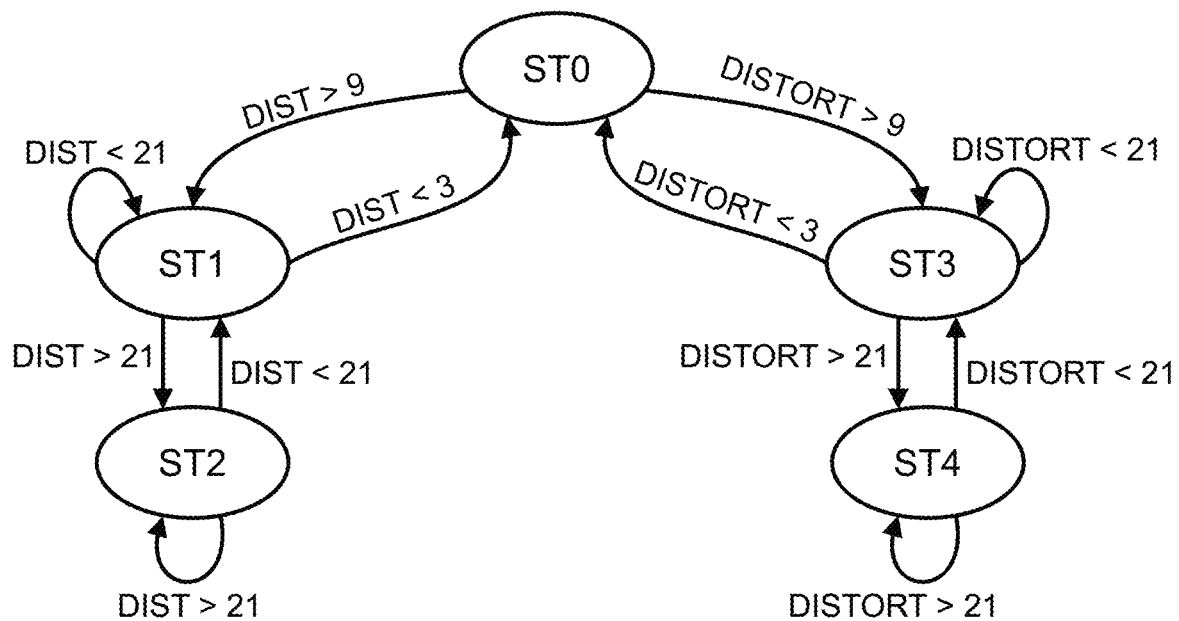
FIG. 7 is a diagram of the different states of the FSM of FIG. 3 and state-change conditions therefor.

The state transitions of the FSM 24 to achieve this operation will now be described with reference to FIG. 7. The states transition between the following:

ST0 (Locked State): Here the zero crossing aligns with minimal error, and the coefficients remain constant. The FSM 24 holds its state at ST0 when both DIST and DISTORT values stay below a number N (e.g., N=9). Transitions occur when:
- ABS (DIST) exceeds a number N (e.g., 9), in response to which the FSM 24 transitions to state ST1; and
- ABS (DISTORT) exceeds a number N (e.g., 9), in response to which the FSM 24 transitions to ST3.

ST1 (Phase Fine State): In this state, phase refinement takes place through the updating of the phase adjustment control signal ADJ_phase using the fine lookup table. Transitions occur when:
- ABS (DIST) is between lower and upper thresholds (e.g., 3 and 21), in response to which the FSM 24 holds its state at ST1;
- ABS (DIST) falls below the lower threshold (e.g., 3), in response to which the FSM 24 reverts its state to ST0; and
- ABS (DIST) exceeds the upper threshold (e.g., 21), in response to which the FSM 24 transitions to ST2.

ST2 (Phase Gross State): Here, coarse phase adjustments are executed, utilizing the gross lookup table to update the phase adjustment control signal ADJ_phase. Transitions occur when:
- ABS (DIST) remains above the upper threshold (e.g., 21), in response to which the FSM 24 holds its state at ST2; and
- ABS (DIST) drops below the upper threshold (e.g., 21), in response to which the FSM 24 reverts its state to ST1.

ST3 (Offset Fine State): Triggered by detected input distortions, this state updates the offset control signal OFCTRL by applying a minimal constant. Transitions occur when:
- ABS (DISTORT) remains below a lower threshold (e.g., 3), in response to which the FSM 24 holds its state at ST3;
- ABS (DISTORT) falls below a lower threshold (e.g., 3), in response to which the FSM 24 reverts its state to ST0; and
- ABS (DISTORT) exceeds an upper threshold (e.g., 21), in response to which the FSM 24 transitions to ST4.

ST4 (Offset Gross State): A more aggressive state in managing offsets, this state updates the offset control signal OFCTRL by applying a larger, predefined constant. Transitions occur when:
- ABS (DISTORT) exceeds an upper threshold (e.g., 21), in response to which the FSM 24 holds its state at ST4; and
- ABS (DISTORT) falls below the upper threshold (e.g., 21), in response to which the FSM 24 reverts its state to ST3.

The gross and fine lookup tables, used by the FSM 24 in generating and dynamically modifying ADJ_phase, are now described in greater detail. The gross lookup table contains 80 coefficients, each spanning a width of 20 bits. Each of these coefficients increments the filter phase by approximately 1.125 degrees. As the circuit 10 is powered-on, the coefficient index is set at 40, which configures the AAP phase to −45 degrees. When the FSM 24 is in state ST2, the coefficient k for ADJ_phase the current cycle is determined by summing the current index with DIR, which can either increment, decrement, or maintain its value. The coefficient k is read directly from the gross lookup table using the newly computed index. Mathematically, this is represented as:

$$\text{index}=\text{index}+\text{DIR}$$

$$\text{Coefficient\_phase}(k)=\text{Gross\_Table}(\text{index})$$

In contrast, the fine lookup table contains 80 constants, each with an 8-bit width. When in state ST1, the FSM 24 calculates the coefficient for the current cycle k by adding the coefficient of the preceding cycle, k−1, with the product of the current index of the fine lookup table and DIR. This is mathematically represented as:

$$\text{Coefficient\_phase}(k)=\text{Coefficient\_phase}(k-1)+\text{Fine\_Table}(\text{index})*\text{DIR}$$

Figure 8:
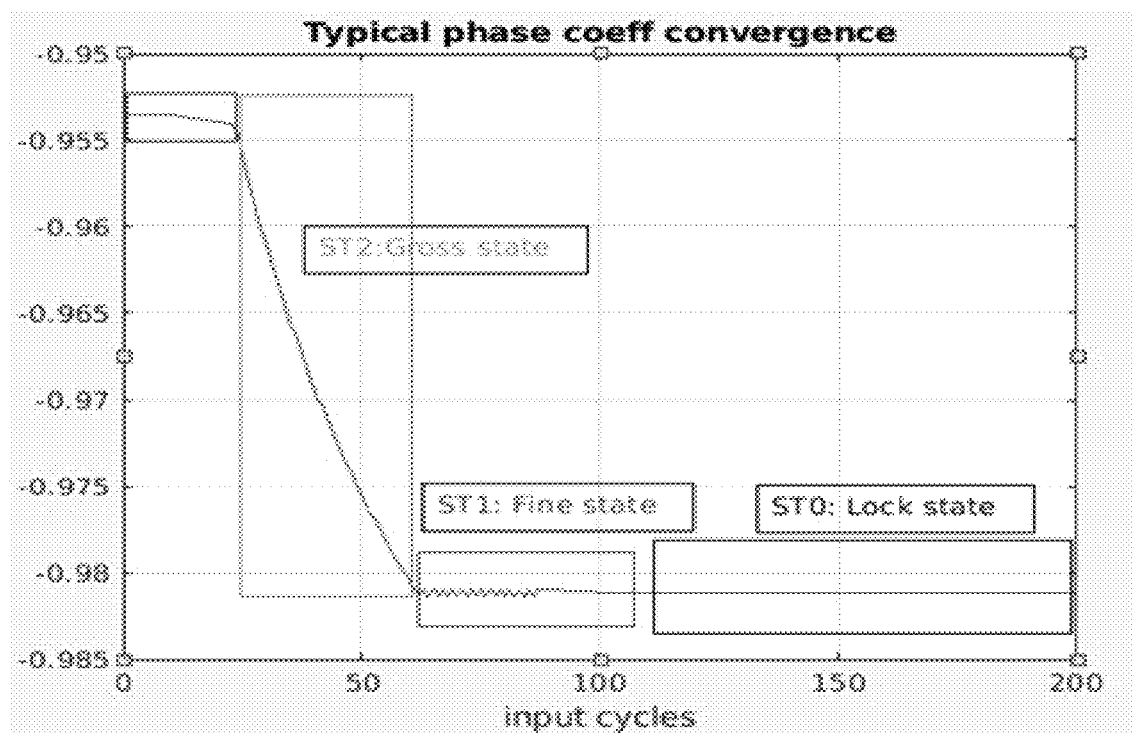
FIG. 8 is a graph showing gross and fine tuning of the coefficients applied in tuning the phase control signal.

The gross and fine adjustment of the phase of IN performed by adjustment of the phase adjustment control signal ADJ_phase by the FSM 24 can be seen in FIG. 8.

Returning now to FIG. 7 to discuss the adjustment of ADJ_offset by the FSM 24, in state ST3, the offset coefficient k for ADJ_offset for the current cycle is calculated by the FSM 24 by adding a given number (e.g., 300, this number being about 1/30000 of the full scale digital swing $2^{23}$) to the coefficient of the previous cycle, k−1. In state ST4, the offset coefficient for the current cycle k is calculated by the FSM 24 by adding a given number (e.g., 4000, this number being about 1/2000 of the full scale digital swing $2^{23}$) to the coefficient of the previous cycle, k−1.

In the context of the above description, as explained, "convergence" refers to the process by which the zero-crossing detection circuit 10 self-adjusts and stabilizes through adjustment of ADJ_phase and ADJ_offset to consistently and accurately detect zero-crossings of the input signal over consecutive cycles. A quicker convergence time signifies that the circuit 10 reaches stable operating condition in fewer signal cycles, thereby offering rapid and reliable zero-crossing detection.

The term "zero-crossing error" quantifies the difference or discrepancy between the exact point where the input signal crosses zero and the point where the zero-crossing detection circuit 10 identifies or detects the zero-crossing. A smaller zero-crossing error indicates a higher precision in detection.

Figure 9:
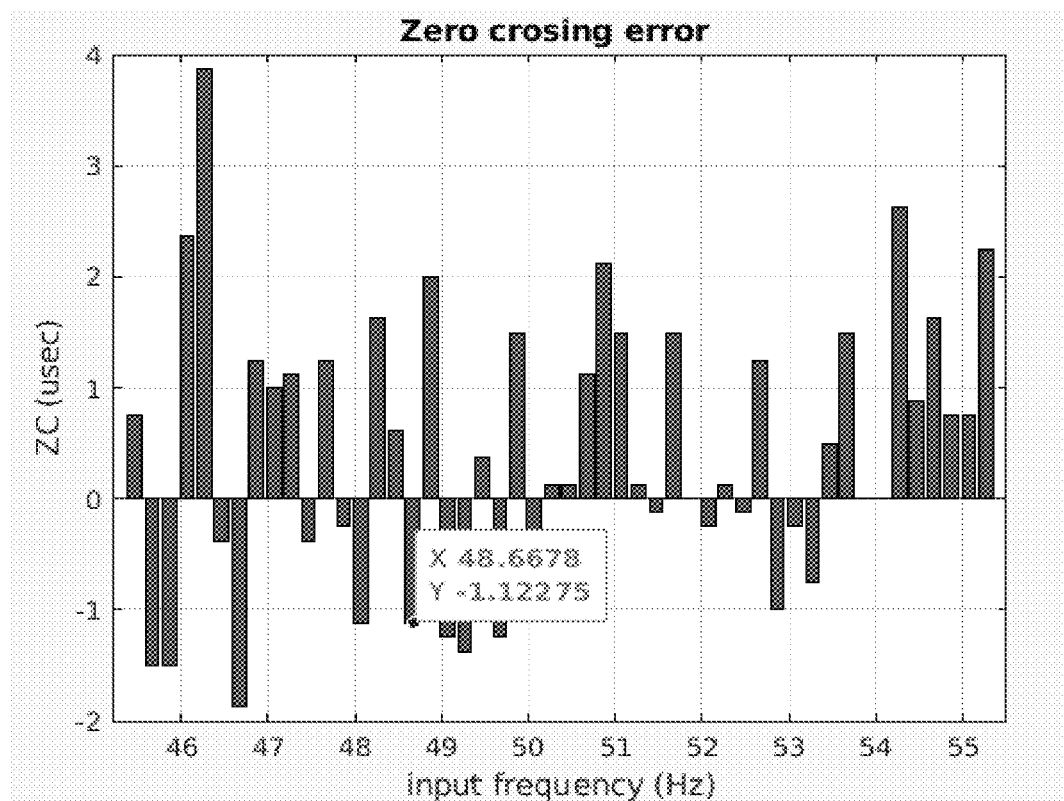
FIG. 9 is a graph detailing the zero-crossing error performance with a pure sinusoid input.

Referring now to FIG. 9, the performance of the zero-crossing detection circuit 10 when subjected to a pure sinusoid input is shown. As illustrated in FIG. 9, robust performance is exhibited with a convergence time averaging approximately 150 cycles. This convergence time remains consistent across varying input frequencies ranging between 45 to 65 Hz. The precision of the zero-crossing detection circuit 10 is further highlighted with a phase error being maintained under 0.01 degrees and a zero-crossing error showcasing the circuit's accuracy in pinpointing the exact zero-crossing point. Additionally, frequency error observed is less than 0.2 mHz. One of the attributes of the circuit 10, as can be deduced from FIG. 9, is its ability to accurately track changes in the input frequency at a rate of 0.02 Hz/sec.

Figure 10:
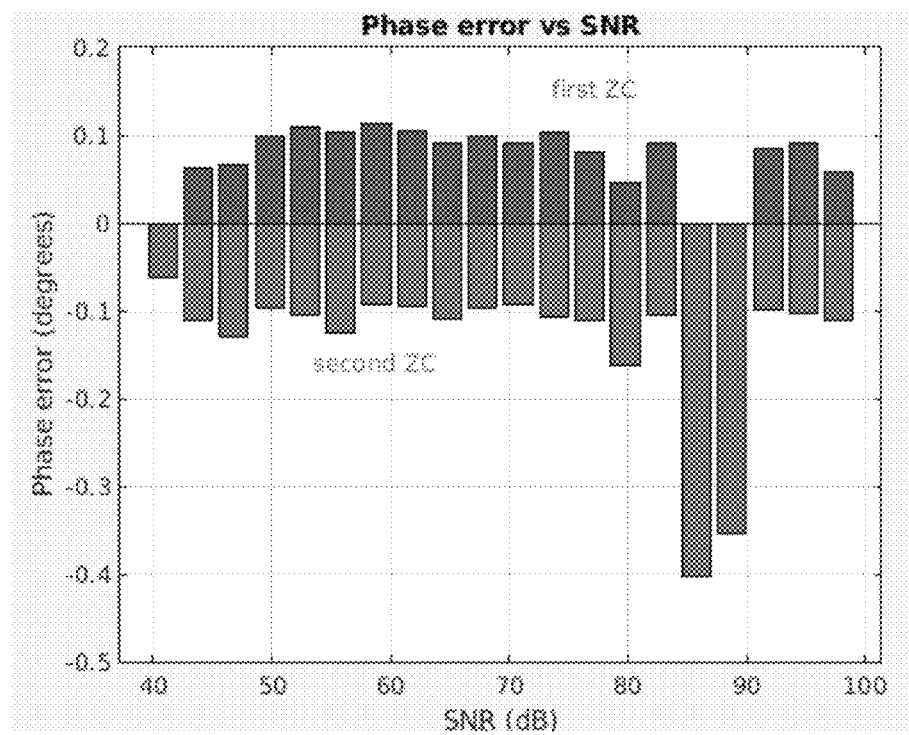
FIG. 10 is a graph demonstrating phase error in relation to the Signal-to-Noise Ratio (SNR) for the zero-crossing detection circuit.
Figure 11:
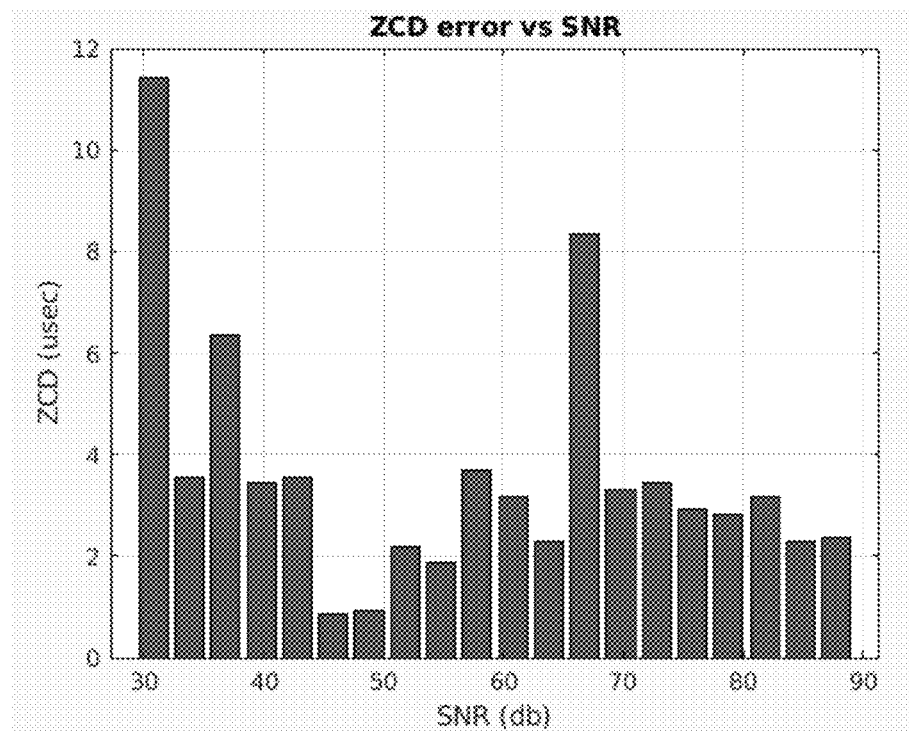
FIG. 11 a graph comparing zero-crossing error with SNR for the detection circuit.

Turning now to FIG. 10, the graph illustrates phase error as a function of the Signal to Noise Ratio (SNR), while FIG. 11 provides insights into zero-crossing error relative to SNR. In these scenarios, the input signal is a pure sinusoid subjected to white noise interference. The robustness of the circuit 10 is evident as phase errors are kept below 0.1 degrees. Even with noise interference, zero-crossing errors remain below 10 microseconds for SNRs greater than 30 dB, emphasizing the precision in detection provided by the circuit 10. The frequency error in these conditions is observed to be less than 0.3 mHz. Furthermore, despite the noise interference, a typical lock time of under 500 sinusoid cycles is achieved, reinforcing the reliability of the circuit 10.

Figure 12:
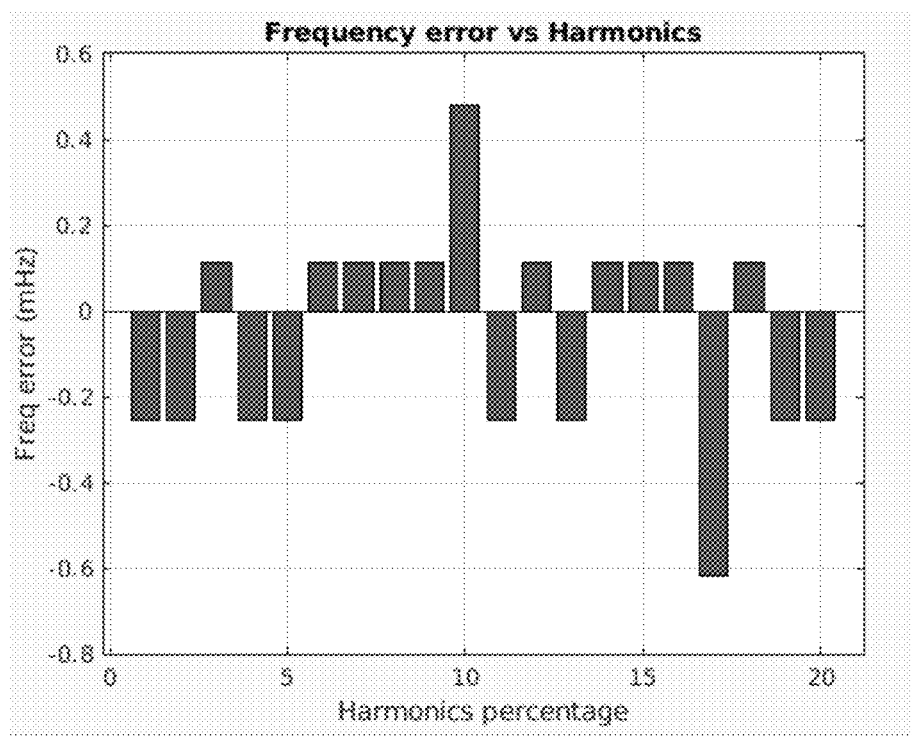
FIG. 12 is a graph illustrating frequency error induced by varying harmonics.
Figure 13:
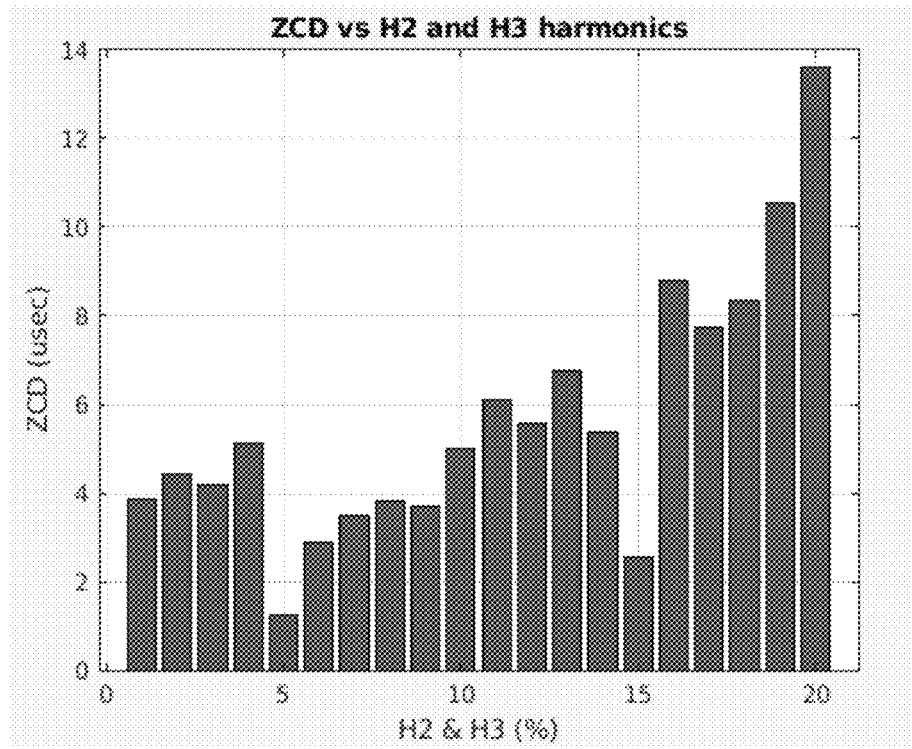
FIG. 13 is a graph showing the relationship between zero-crossing errors and the presence of the 2nd and 3rd harmonics.

In FIGS. 12 and 13, the performance of the zero-crossing detection circuit is illustrated in the presence of both the 2nd and the 3rd harmonics on a pure sinusoid input. The zero-crossing errors recorded, even with 20% of H2 and H3 harmonics, are on the order of 20 microseconds. Such precision is further complemented with a frequency error being maintained below 0.6 mHz. In these harmonic-rich conditions, the circuit 10 demonstrates a lock time under 1500 sinusoid cycles, showcasing its adaptability and resilience to harmonic interferences.

Figure 14:
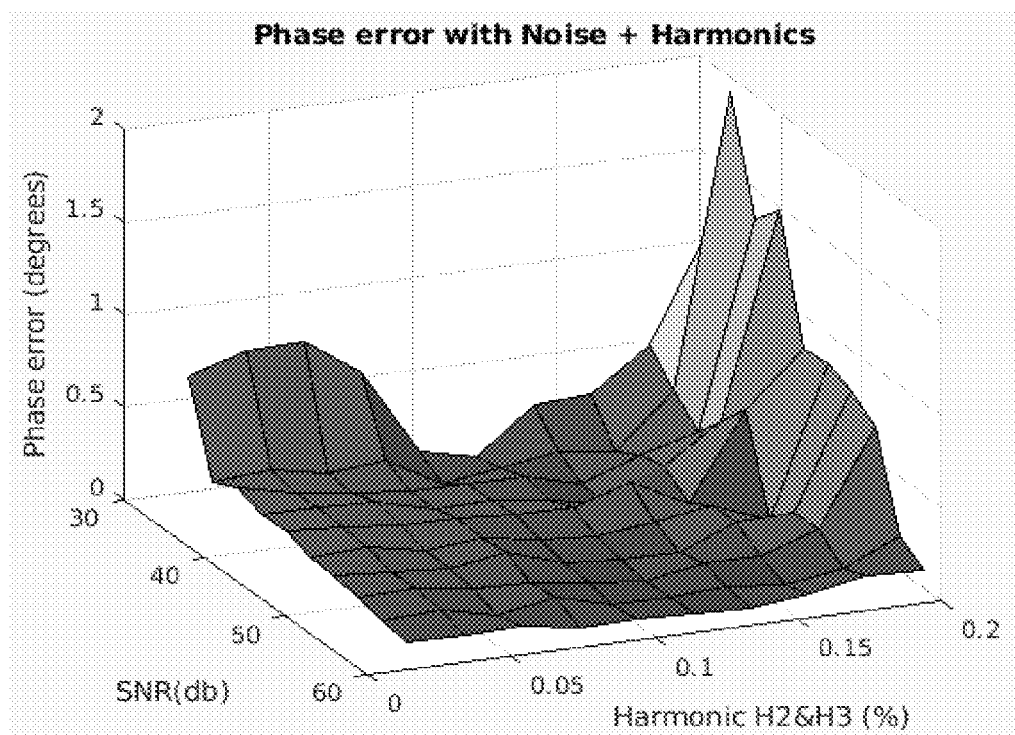
FIG. 14 is a graph showing the phase error performance of the detection circuit in environments with both distortion and noise.
Figure 15:
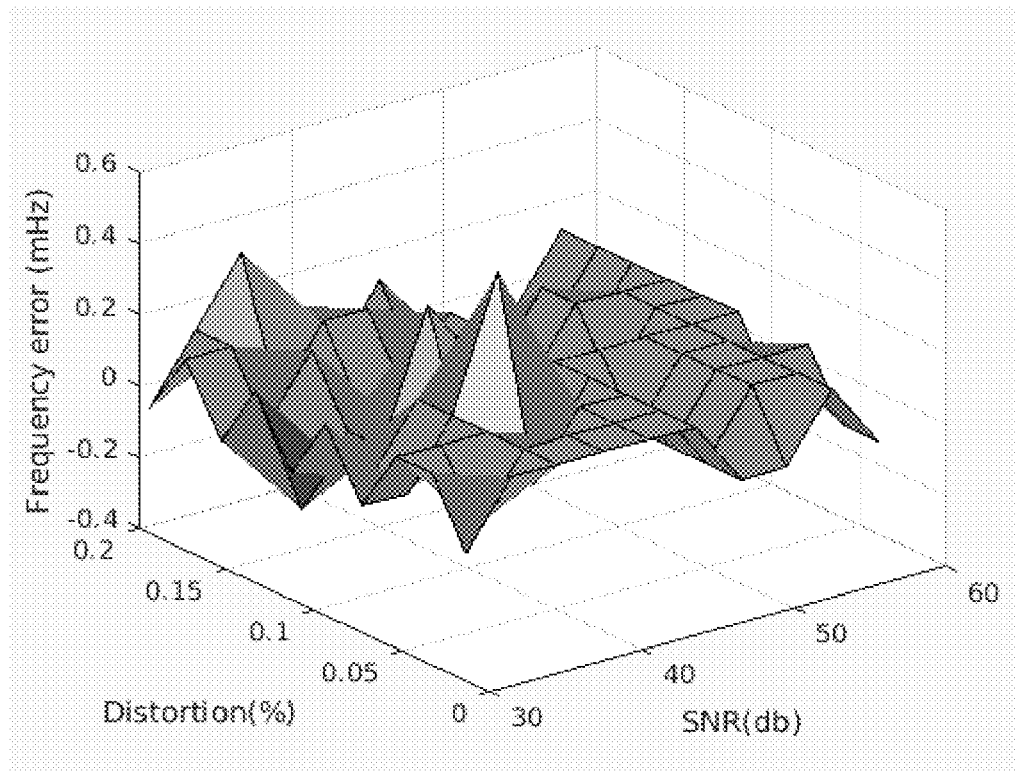
FIG. 15 is a graph further elaborating on the performance metrics of FIG. 14, presenting data on the zero-crossing detection accuracy amidst noise and harmonics.

Lastly, FIGS. 14 and 15 present a view of the performance of the circuit 10 when subjected to both distortion and noise. These figures elaborate on the phase error in the presence of both noise and harmonics, further underlining the capability of the circuit 10 to consistently detect zero-crossings even in challenging signal conditions.

In conclusion, the zero-crossing detection circuit 10, as described herein and illustrated through FIGS. 1 to 15, provides high precision, reliability, and adaptability across various signal conditions, making it usable in a wide variety of applications.

Figure 16:
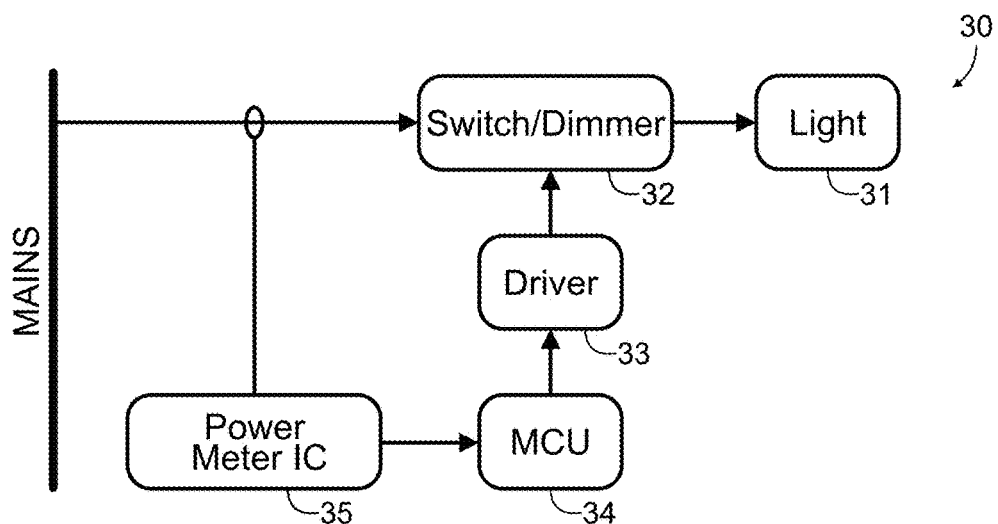
FIG. 16 is a block diagram of a sample application of the zero-crossing detection circuit of FIG. 2 in a light control system.

A sample application for the zero-crossing detection circuit 10 is shown in FIG. 16. Here, a switch/dimmer circuit 32 receives a power signal from power mains and provides it (optionally with dimming control) to a light 31. The switch/dimmer circuit 32 is driven by output from a driver 33, with the driver 33 being controlled by output from a microcontroller 34. The microcontroller 34 controls the driver 33 based upon feedback about the power signal provided by a power meter circuit 35.

Figure 17:
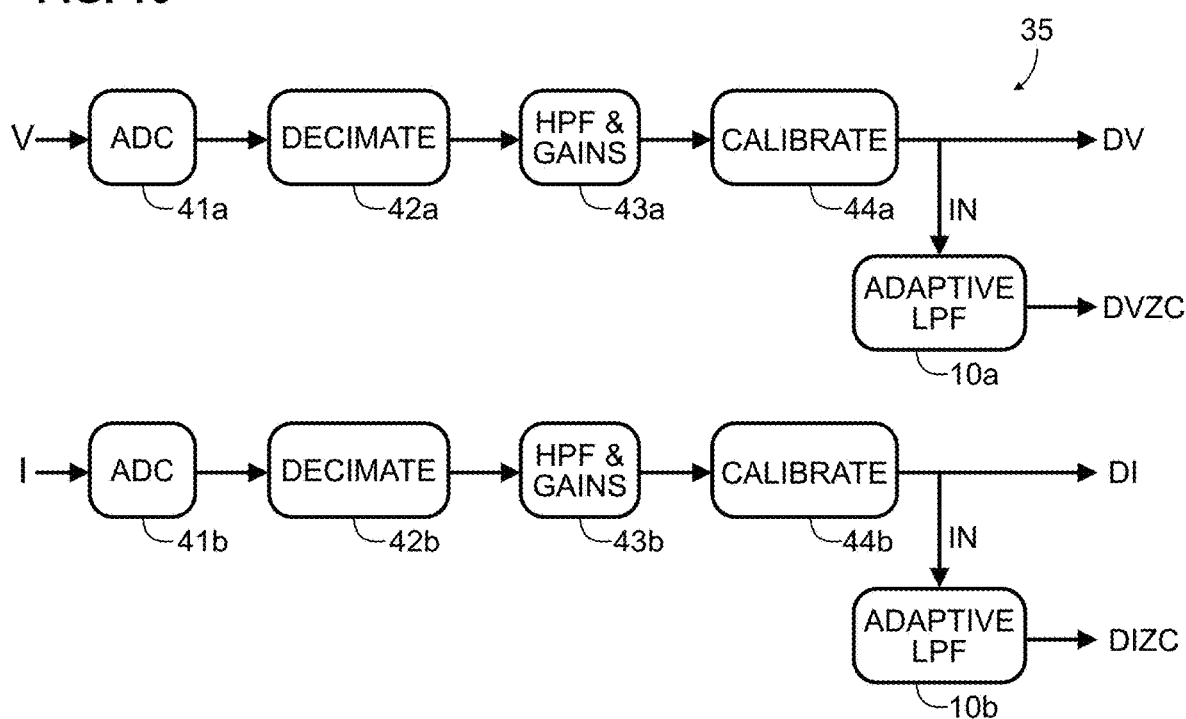
FIG. 17 is a block diagram of the power meter circuit of FIG. 16, highlighting its connection with the zero-crossing detection circuit of FIG. 2.

The power meter circuit 35 is described in greater detail with reference to FIG. 17. Note here that a first ADC 41*a* generates a digital representation of the voltage of the power signal, that a decimator 42*a* decimates that digital representation, and that a high-pass filter 43*a* performs high pass filtering (and optionally applies gain to) the decimates version of the digital representation. A calibration circuit 44*a* calibrates the resulting filtered signal to provide a digital voltage signal DV, and an adaptive low-pass filter 10*a* (including the zero-crossing detection circuit 10 described above) determines zero crossings of the filtered signal after calibration and asserts a signal DVZC based thereupon. Similarly, a second ADC 41*b* generates a digital representation of the current of the power signal, a decimator 42*b* decimates that digital representation, and a high-pass filter 43*b* performs high pass filtering (and optionally applies gain to) the decimated version of the digital representation. A calibration circuit 44*b* calibrates the resulting filtered signal to provide a digital current signal DI, and an adaptive low-pass filter 10*b* (including the zero-crossing detection circuit 10 described above) determines zero crossings of the filtered signal after calibration and asserts a signal DIZC based thereupon. DV, DVZC, DI, and DIZC are utilized by the MCU 34 in controlling the driver 33.

Finally, it is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A circuit configured for detection of a zero crossing in a power signal, comprising:
a low-pass filter (LPF) configured to receive an input signal indicative of the power signal and to introduce a phase shift dependent on a frequency of the input signal;
filter circuitry configured to: receive an output of the LPF and to apply a fixed phase shift thereto, and adjust phase and DC offset correction of the output of the LPF based on control signals to produce a filtered output signal; and
control circuitry comprising:
a zero crossing detector configured to receive the input signal and the filtered output signal, detect zero crossings of the input signal and the filtered output signal, assert a digital zero cross signal at each zero crossing, and determine a phase shift and DC offset correction between the input signal and filtered output signal; and
a controller configured to generate the control signals, based upon the phase shift and DC offset correction, such that a total phase shift between the input signal and the filtered output signal is constant and there is a same duty cycle between the input signal and the filtered output signal, thereby providing for accurate zero crossing detection by the zero crossing detector.

2. The circuit of claim 1, wherein the control circuitry further comprises a slope detector configured, at each zero crossing of the input signal and the filtered output signal, to determine a difference between slopes of the input signal and the filtered output signal and provide feedback to the controller to cause the controller to adjust phase and DC offset correction applied by the filter circuitry to the input signal based on the determined difference.

3. The circuit of claim 2, wherein the controller is configured to transition between multiple states to adjust the phase and DC offset correction applied by the filter circuitry, the multiple states including at least: a locked state in which no adjustments are made to the phase correction; a phase fine state in which fine adjustments are made to the phase correction; a phase gross state in which gross adjustments are made to the phase correction; an offset fine state in which fine adjustments are made to the DC offset correction; and an offset gross state in which gross adjustments are made to the DC offset correction.

4. The circuit of claim 3, wherein in the phase fine state and the phase gross state, the controller is configured to utilize gross and fine lookup tables to determine adjustments for the phase correction applied by the filter circuitry to the input signal.

5. The circuit of claim 4, wherein the gross lookup table contains coefficients that increment the phase correction applied by the filter circuitry by different given gross degree values, and the fine lookup table contains coefficients that increment the phase correction applied by the filter circuitry for given different fine degree values.

6. The circuit of claim 5, wherein the gross and fine lookup tables contain coefficients derived from historical zero crossing data of the input signal and output filtered signal.

7. The circuit of claim 2, wherein the control circuitry is configured to generate phase and offset adjustment control signals, and wherein the filter circuitry is configured to use these phase and offset adjustment control signals to adjust both the phase and the offset correction applied by the filter circuitry to the input signal.

8. The circuit of claim 1, wherein the total phase shift between the input signal and the filtered output signal is 180°.

9. The circuit of claim 1, wherein the filter circuitry comprises:
a fixed all-pass (FAP) filter configured to receive the output of the LPF and to apply the fixed phase shift thereto; and
an adaptive all-pass (AAP) filter configured to receive the output of the FAP filter and adjust its phase and DC offset correction based on the control signals to produce the filtered output signal.

10. A method for detecting a zero crossing in a power signal, comprising:
receiving an input signal indicative of the power signal at a low-pass filter (LPF) which introduces a phase shift dependent on a frequency of the input signal;
passing an output of the LPF through filter circuitry which applies a fixed phase shift thereto and which adjusts phase of the output of the LPF based upon received control signals to produce a filtered output signal;
detecting zero crossings of the input signal and the filtered output signal and asserting a digital zero cross signal at each zero crossing, and determining a phase shift and DC offset correction between the input signal and filtered output signal; and
generating the control signals based upon the determined phase shift and DC offset correction such that a total phase shift between the input signal and the filtered output signal remains constant and there is a same duty cycle between the input signal and the filtered output signal to thereby provide for accurate detection of the zero crossings of the input signal.

11. The method of claim 10, further comprising: at each detected zero crossing of the input signal and the filtered output signal, determining a difference between slopes of the input signal and the filtered output signal; and providing feedback based on the determined difference to adjust phase and DC offset correction applied to the input signal.

12. The method of claim 10, further comprising: transitioning between multiple states to adjust the phase and DC offset correction applied to the input signal, the states including at least: a locked state, in which no adjustments are made to the phase correction; a phase fine state in which fine adjustments are made to the phase correction; a phase gross state in which gross adjustments are made to the phase correction; an offset fine state in which fine adjustments are made to the DC offset correction; and an offset gross state in which gross adjustments are made to the DC offset correction.

13. The method of claim 12, wherein during the phase fine state and the phase gross state, gross and fine lookup tables are utilized to determine adjustments for the phase correction applied to the input signal.

14. The method of claim 10, wherein passing the output of the LPF through filter circuitry which applies a fixed phase shift thereto and which adjusts phase and DC offset correction of the output of the LPF based upon received control signals to produce a filtered output signal comprises:
passing the output of the LPF through a fixed all-pass (FAP) filter which applies a fixed phase shift thereto; and
passing the output of the FAP filter through an adaptive all-pass (AAP) filter which adjusts phase and DC offset correction of the output of the FAP filter based on received control signals to produce a filtered output signal.

15. A circuit configured for detection of a zero crossing in a power signal, comprising:
a low-pass filter (LPF) configured to receive an input signal indicative of the power signal and to introduce a phase shift dependent on the frequency of the input signal;
filter circuitry configured to: receive output of the LPF and to apply a fixed phase shift thereto, and adjust phase of the output of the LPF based on control signals to produce a filtered output signal; and
control circuitry comprising:
a zero crossing detector configured to receive the input signal and the filtered output signal, detect zero crossings of the input signal and the filtered output signal, assert a digital zero cross signal at each zero crossing, and determine a phase shift between the input signal and filtered output signal; and
a controller configured to generate the control signals, based upon the phase shift, such that a total phase shift between the input signal and the filtered output signal is constant and there is a same duty cycle between the input signal and the filtered output signal, thereby providing for accurate zero crossing detection by the zero crossing detector.

16. The circuit of claim 15, wherein the control circuitry further comprises a slope detector configured, at each zero crossing of the input signal and the filtered output signal, to determine a difference between slopes of the input signal and the filtered output signal and provide feedback to the controller to cause the controller to adjust a phase correction applied by the filter circuitry to the input signal based on the determined difference.

17. The circuit of claim 16, wherein the controller is configured to transition between multiple states to adjust the phase correction applied by the filter circuitry, the multiple states including at least: a locked state in which no adjustments are made to the phase correction; a phase fine state in which fine adjustments are made to the phase correction; and a phase gross state in which gross adjustments are made to the phase correction.

18. The circuit of claim 17, wherein in the phase fine state and the phase gross state, the controller is configured to utilize gross and fine lookup tables to determine adjustments for the phase correction applied by the filter circuitry to the input signal.

19. The circuit of claim 18, wherein the gross lookup table contains coefficients that increment the phase correction applied by the filter circuitry by different given gross degree values, and the fine lookup table contains coefficients that increment the phase correction applied by the filter circuitry for given different fine degree values.

20. The circuit of claim 19, wherein the gross and fine lookup tables contain coefficients derived from historical zero crossing data of the input signal and output filtered signal.

21. The circuit of claim 16, wherein the control circuitry is configured to generate phase adjustment control signals, and wherein the filter circuitry is configured to use these phase adjustment control signals to adjust the phase correction applied by the filter circuitry to the input signal.

22. The circuit of claim 15, wherein the total phase shift between the input signal and the filtered output signal is 180°.

23. The circuit of claim 15, wherein the filter circuitry comprises:
- a fixed all-pass (FAP) filter configured to receive the output of the LPF and to apply the fixed phase shift thereto; and
- an adaptive all-pass (AAP) filter configured to receive the output of the FAP filter and adjust its phase based on the control signals to produce the filtered output signal.

* * * * *